US011302462B2

(12) United States Patent
Schott et al.

(10) Patent No.: US 11,302,462 B2
(45) Date of Patent: Apr. 12, 2022

(54) METHOD FOR PRODUCING A PLURALITY OF RESISTANCE MODULAR UNITS OVER A CERAMIC SUBSTRATE

(71) Applicant: Vishay Electronic GMBH, Selb (DE)

(72) Inventors: Bertram Schott, Selb (DE); Ondrej Sobora, Selb (DE); Kerstin Tillmann, Oberasbach (DE)

(73) Assignee: VISHAY ELECTRONIC GMBH, Selb (DE)

( * ) Notice: Subject to any disclaimer, the term of this patent is extended or adjusted under 35 U.S.C. 154(b) by 0 days.

(21) Appl. No.: 17/255,803

(22) PCT Filed: Jun. 12, 2019

(86) PCT No.: PCT/EP2019/065399
§ 371 (c)(1),
(2) Date: Dec. 23, 2020

(87) PCT Pub. No.: WO2020/001982
PCT Pub. Date: Jan. 2, 2020

(65) Prior Publication Data
US 2021/0272724 A1 Sep. 2, 2021

(30) Foreign Application Priority Data
Jun. 25, 2018 (DE) ......................... 102018115205.1

(51) Int. Cl.
*H01C 1/14* (2006.01)
*H01C 1/01* (2006.01)
(Continued)

(52) U.S. Cl.
CPC ................. *H01C 1/14* (2013.01); *H01C 1/01* (2013.01); *H01C 17/242* (2013.01); *H01C 17/006* (2013.01)

(58) Field of Classification Search
CPC .......... H01C 1/14; H01C 1/01; H01C 17/242; H01C 17/006; H01C 17/281; H01C 7/18
See application file for complete search history.

(56) References Cited

U.S. PATENT DOCUMENTS 5,104,480 A 4/1992 Wojnarowski
5,976,392 A 11/1999 Chen
(Continued)

FOREIGN PATENT DOCUMENTS

DE 19755753 A1 6/1999
DE 10110179 A1 12/2002
(Continued)

OTHER PUBLICATIONS

Vishay Beyschlag, "Precision Thin Film Chip Resistor Array Superior Moisture Resistivity; ACAS 0606 AT, ACAS 0612 AT—Precision," (Retrieved: May 16, 2017) (8 pages).
(Continued)

*Primary Examiner* — Kyung S Lee
(74) *Attorney, Agent, or Firm* — Volpe Koenig

(57) ABSTRACT

A method of manufacturing resistor units that each comprise a carrier comprising resistor elements including ends with a respective first and second electrical terminal is disclosed. The method includes: a) providing a carrier plate; b) forming strips of a resistor material at the lower side of the carrier plate in a regular pattern such that a respective row of strips of the resistor material is formed along a longitudinal direction; c) forming a plurality of zones of an electrically conductive material at the lower side of the carrier plate in a regular pattern such that a respective row of zones of the electrically conductive material is formed along the longitudinal direction; and d) cutting through the carrier plate by regular transverse incisions, first longitudinal incisions, and second longitudinal incisions such that a respective resistor
(Continued)

unit and a respective residual section are alternately formed along a transverse direction.

17 Claims, 6 Drawing Sheets

(51) Int. Cl.
*H01C 17/242* (2006.01)
*H01C 17/00* (2006.01)

(56) References Cited

U.S. PATENT DOCUMENTS

| | | | | |
|---|---|---|---|---|
| 6,238,992 | B1 * | 5/2001 | Yamada | H01C 7/001 338/203 |
| 6,727,111 | B2 * | 4/2004 | Tsukada | H01C 7/003 29/610.1 |
| 6,806,167 | B2 * | 10/2004 | Kuriyama | H01C 17/006 438/460 |
| 7,378,937 | B2 * | 5/2008 | Tsukada | H01C 1/144 338/308 |
| 7,380,333 | B2 * | 6/2008 | Tsukada | H01C 17/006 264/272.14 |
| 7,749,867 | B2 * | 7/2010 | Fukuyo | C03B 33/033 438/463 |
| 7,882,621 | B2 * | 2/2011 | Chen | H01C 17/06 29/621 |
| 7,907,046 | B2 * | 3/2011 | Tsukada | H01C 17/006 338/309 |
| 8,081,059 | B2 * | 12/2011 | Tanimura | H01C 7/003 338/309 |
| 8,263,479 | B2 * | 9/2012 | Fukuyo | H01L 24/27 438/460 |
| 2002/0130761 | A1 | 9/2002 | Tsukada | |
| 2003/0005576 | A1 | 1/2003 | Tsukada | |
| 2004/0113750 | A1 | 6/2004 | Matsukawa et al. | |
| 2004/0126704 | A1 | 7/2004 | Werner | |
| 2006/0261924 | A1 | 11/2006 | Swenson | |
| 2014/0055228 | A1 | 2/2014 | Wang | |

FOREIGN PATENT DOCUMENTS

| | | | |
|---|---|---|---|
| EP | 0078089 | A1 | 5/1983 |
| EP | 0484756 | A2 | 5/1992 |
| GB | 2 332 569 | A | 6/1999 |
| JP | S60166102 | U | 5/1985 |
| JP | H0330409 | U | 3/1991 |
| JP | H0699567 | A | 4/1994 |
| JP | H07 302704 | A | 11/1995 |
| JP | 3358990 | B2 | 12/2002 |
| JP | 2006313785 | A | 11/2006 |

OTHER PUBLICATIONS

Vishay Draloric / Beyschlag, "Vishay Draloric / Beyschlag SMD Resistor Solutions for All Types of Applications," (Retrieved: May 16, 2017) (14 pages).

* cited by examiner

METHOD FOR PRODUCING A PLURALITY OF RESISTANCE MODULAR UNITS OVER A CERAMIC SUBSTRATE

CROSS REFERENCE TO RELATED APPLICATIONS

This application is a 371 national phase application of International Application No. PCT/EP2019/065399, filed Jun. 12, 2019, which claims priority to German Patent Application No. 102018115205.1, filed Jun. 25, 2018, which are both incorporated by reference as if fully set forth herein.

FIELD OF INVENTION

The present invention relates to a method of manufacturing a plurality of resistor units that each comprise a carrier comprising a group of resistor elements at whose ends a respective first and second electrical terminal is provided.

BACKGROUND

Such methods serve for the manufacture of resistor units that can be used in electrical components and/or electrical devices and that can be conductively connected to the circuits of the components or of the devices by means of the electrical terminals. The resistor units can have at least two resistor elements that are formed at one side of a carrier in strips arranged in parallel with one another. For example, the strips of the resistor elements can be twice as wide as long, whereby an approximately square shape typically results for the resistor units. It may be necessary also to correspondingly reduce the size of the resistor units for a use in components or devices that are becoming smaller and smaller. It has, however, not yet been possible with the known methods to manufacture resistor units whose dimensions, expressed in length by width, are less than 0.8 mm×0.6 mm.

It is therefore the object of the invention to provide a method by means of which a plurality of resistor units that have been reduced in size can be manufactured inexpensively, reliably, and efficiently.

SUMMARY

The object is satisfied by a method comprising the steps:

a. providing a carrier plate that has an upper side and a lower side;

b. forming a plurality of strips of a resistor material at the lower side of the carrier plate, that have a first end and a second end along a transverse direction, in a regular pattern such that a respective row of strips of the resistor material is formed along a longitudinal direction that extends perpendicular to the transverse direction and such that a plurality of such rows are arranged next to one another in the transverse direction;

c. forming a plurality of zones of an electrically conductive material at the lower side of the carrier plate, that have a first end, an intermediate region, and a second end along the transverse direction, in a regular pattern such that a respective row of zones of the electrically conductive material is formed along the longitudinal direction and such that a plurality of such rows are arranged next to one another in the transverse direction, wherein the rows of strips of the resistor material and the rows of zones of the electrically conductive material are arranged alternately in the transverse direction, and wherein, with the exception of border regions of the carrier plate, the strips of the resistor material overlap the first end of a respective zone of the electrically conductive material at their first ends and overlap the second end of a respective zone of the electrically conductive material at their second ends; and cutting through the carrier plate by regular transverse incisions along the transverse direction, first longitudinal incisions along the longitudinal direction, and second longitudinal incisions along the longitudinal direction such that the transverse incisions extend between groups of strips of the resistor material that are associated with one another and that are adjacent to one another in the longitudinal direction, such that furthermore the first longitudinal incisions detach the first ends from the intermediate regions of a respective row of zones of the electrically conductive material, and such that the second longitudinal incisions detach the second ends from the intermediate regions of a respective row of zones of the electrically conductive material (in particular of the aforesaid row or of another row) such that a respective resistor unit and a respective residual section of the carrier plate are alternately formed along the transverse direction, said residual section including separated intermediate regions of a row of zones of the electrically conductive material.

In the method in accordance with the invention, the resistor material and the electrically conductive material are thus applied to the carrier plate in a respective regular manner in strips or zones, with the applied resistor material and the applied electrically conductive material overlapping at specific regions. These overlap regions serve as electrical terminals of the resistor units by means of which the resistor units can be conductively connected to the electrical component or device.

The separation, i.e., the formation of individual resistor units, takes place at the end of the method with suitable incisions of the carrier plate cutting through the carrier plate in the longitudinal direction and in the transverse direction, and indeed such that a plurality of resistor units are immediately manufactured. The transverse direction and the longitudinal direction in this respect define two reference directions that extend perpendicular to one another and do not necessarily designate a longitudinal form of the carrier plate, of the strips of the resistor material, or of the resistor unit.

Residual sections of the carrier plate that admittedly arise as rejects in the manufacturing method are formed by the detachment of the intermediate regions of the zones of the electrically conductive material. However, the size of the electrical terminals of the formed resistor elements can be set in a simple manner by a suitable selection of the first and second longitudinal incisions and can in particular be minimized independently of the size of the zones (that cannot be reduced to any desired size) of the electrically conductive material. The intermediate regions of the zones of the electrically conductive material furthermore enable an inspection of the electrical resistance before the detachment in accordance with an advantageous embodiment explained in the following.

In accordance with the method in accordance with the invention, the rows of strips of the resistor material and the rows of zones of the electrically conductive material are arranged next to one another, but not necessarily in the same number, alternately in the transverse direction. For example, with the exception of border regions of the carrier plate, a respective row of zones of the electrically conductive material can be arranged between two rows of strips of the resistor material, with the number of rows of strips of the resistor material in particular being able to correspond to the number of rows of zones of the electrically conductive material. It is, however, also alternatively possible that, with the exception of border regions of the carrier plate, two respective rows of zones of the electrically conductive material are arranged between two rows of strips of the resistor material, with the number of rows of zones of the electrically conductive material in particular being able to be twice as much as the number of rows of strips of the resistor material. In the last-named case, ultimately only one of the two ends of a respective zone of the electrically conductive material overlaps a strip of the resistor material, while the other end of the respective zone is detached in step d) and thus does not serve to contact a strip of the resistor material.

Resistor units of the most varied sizes can be manufactured by a suitable selection of the length and width of the mutual spacings of adjacent strips of the resistor material and of the mutual spacings of adjacent zones of the electrically conductive material.

No restrictions with respect to the dimensions of the resistor units are produced from the method. Resistor units can in particular be manufactured by means of the method that are characterized by small dimensions and that can also be used in components or devices that require a particularly compact design of the resistor units such as cellular phones, smartphones, smart watches, hearing aids, or similar devices.

Preferred embodiments can be seen from description.

In accordance with an embodiment, the respective resistor unit formed by the cutting through of the carrier plate comprises a section of the carrier plate that forms the carrier of the resistor unit, a group of strips of the resistor material that form the group of resistor elements of the resistor unit, a plurality of first ends of zones of the electrically conductive material that form the first electrical terminals of the resistor elements, and a plurality of second ends of zones of the electrically conductive material that form the second electrical terminals of the resistor elements. Each resistor element is thus electrically conductively connected to a respective end of a zone of the electrically conductive material in the transverse direction by an overlap of its two ends, said respective ends serving as respective electrical terminals for the connection to the electrical component or device.

The mutual spacings of the transverse incisions and the mutual spacings of the first and second longitudinal incisions are preferably selected such that the formed resistor unit, in particular a resistor unit having two resistor elements, has a width of less than 0.6 mm and a length of less than 0.8 mm, with the width in particular being in a range from 0.3 mm to 0.34 mm and the length in particular being in a range from 0.54 mm to 0.62 mm, and with the width preferably amounting to approximately 0.32 mm and the length preferably amounting to 0.58 mm. These small dimensions are outside the range of the resistor units that can be manufactured by previous methods. In other words, resistor units can only be manufactured in these dimensions by the method in accordance with the invention.

In accordance with an embodiment, the group of strips of the resistor material comprises two strips of the resistor material. The resistor unit accordingly comprises two resistor elements. Embodiments having more than two, for example three or four, strips of the resistor material are also possible, however. In this respect, each of the resistor elements is separately connectable to an electrical component or device or to an electrical circuit by means of the first or second ends of two zones of the electrically conductive material or of the electrical terminals formed by them.

Different geometries of the resistor units can be achieved in a simple manner with two or more resistor elements by the regular arrangement of the strips of the resistor material and of the zones of the electrically conductive material, in particular by the arrangement of the resistor elements adjoining one another in row form. It is sufficient for this purpose to change the division of the groups of mutually associated adjacent strips and, accompanying this, to change the mutual spacings of the transverse incisions in the manufacturing method.

In accordance with an embodiment, the strips of the resistor material of the formed respective resistor unit are of equal size. In other words, the strips of the resistor material have the same widths, the same lengths, and the same thicknesses. A resistor unit is thus formed whose resistor elements have the same resistance values.

In accordance with a further embodiment, the strips of the resistor material of the formed resistor unit are of different sizes, in particular having different widths transversely to the direction of extent of the strips of the resistor material between the first end and the second end. The resistance values of the resistor elements of the respective formed resistor unit can accordingly be of different sizes.

Different geometries of the resistor elements with corresponding different resistance values can be achieved in a simple manner due to the arrangement of the resistor elements adjoining one another in a strip-like manner. It is sufficient for this purpose to change the length of the strips of the resistor material in the method and, coordinated with this, also to change the arrangement and the spacings of adjacent zones of the electrically conductive material.

The carrier plate preferably comprises a ceramic substrate that prevents an electrical contact being present between the resistor material and the electrically conductive material outside the zones of the electrically conductive material, in particular due to the insulating property of said ceramic substrate. Such carrier plates are simple to manufacture and can be manufactured inexpensively and in large volumes. In another respect, the ceramic substrate makes possible a simple and problem-free cutting through of the carrier plate in step d).

In accordance with an embodiment, the resistor material and the electrically conductive material are only applied to the lower side of the carrier plate. This means that the upper side of the carrier of the formed resistor unit is free of resistor elements and/or electrical terminals. The resistor unit is thus configured for an assembly and for a contacting in a flip chip construction. The advantage of this construction is that the electrical terminals of the resistor unit are directly downwardly connectable to the electrical circuit of the device or component and/or are insertable therein, with the attachment of further connector wires to the resistor unit or to the circuit being able to be dispensed with.

In accordance with an embodiment, step b) of the formation of the plurality of strips of the resistor material comprises the application of a metal layer to the lower side of the carrier plate by cathode atomization and by a local removal of the metal layer by vaporization. Layers of the resistor material can be applied in a small thickness to the carrier plate due to the cathode atomization, so-called “sputtering”, and are characterized by a great uniformity and by good reproducibility. This makes possible the manufacture of a plurality of resistor elements whose resistance values are all within a predefined narrow range.

To apply the resistor material to the carrier plate in the form of a plurality of strips, the resistor material outside the predefined regions of the strips can be removed or vaporized, by a laser for example. The resistor material can be restricted precisely and with great positional accuracy to the regions of the strips by means of this method.

Alternatively, a mask can be applied to the lower side of the carrier plate that has a plurality of apertures corresponding to the strips. After application of the mask, the resistor material can be vapor deposited onto the lower side of the carrier plate. The resistor material only comes into contact with the carrier plate at the positions of the apertures through the mask, whereby a plurality of strips of the resistor material are formed on the carrier plate after the removal of the mask. In addition to the large-area application and the local removal of the resistor material or to the application of a mask, other methods are, however, also conceivable to form the strips of the resistor material.

In accordance with an embodiment, step c) of forming the plurality of zones of the electrically conductive material comprises the printing of the lower side of the carrier plate with an electrically conductive paste, in particular with a silver-palladium alloy. A printing plate can, for example, be used for this purpose on which the electrically conductive paste is applied in a regular pattern, with the pattern corresponding to the arrangement of the zones. The pattern of the electrically conductive paste applied to the printing plate is in particular coordinated with the arrangement of the strips of the resistor material.

After the formation of the plurality of zones of the electrically conductive material, a galvanization, in particular a nickel-tin galvanization, of the zones can take place.

It is understood that step b) of forming the plurality of strips of the resistor material and step c) of forming the plurality of zones of the electrically conductive material can also take place in reverse order or in part simultaneously. The overlapping of the strips of the resistor material with the zones of the electrically conductive material can in this respect take place such that the respective strip of the resistor material partly covers the respective zones of the electrically conductive material or such that the respective zones of the electrically conductive material partly cover the respective strip of the resistor material.

In accordance with an embodiment, the cutting through of the carrier plate in step d) takes place by means of a laser beam. In this process, this permits a precise and efficient method for structuring the carrier plate, with it also being possible in this technology to carry out a plurality of cutting through incisions in a brief sequence in one work step. The transverse incisions, the first longitudinal incisions, and the second longitudinal incisions can generally be carried out in any desired order for the cutting through of the carrier plate in step d). The regular arrangement of the transverse incisions, of the first longitudinal incisions, and of the second longitudinal incisions in this respect follows or corresponds to the regular pattern of the strips of the resistor material and to the regular pattern of the zones of the electrically conductive material.

In accordance with an embodiment, the electrical resistance of a respective strip of the resistor material is measured before the cutting through of the carrier plate by the first and second longitudinal incisions, in particular before step d), with contact probes being applied to that zone of the electrically conductive material that overlaps the first end of the respective strip of the resistor material and to that zone of the electrically conductive material that overlaps the second end of the respective strip of the resistor material. The measured values can be checked as part of a quality control as to whether the resistance values are in a predefined nominal range or whether deviations therefrom can be found. The contact probes can in particular be Kelvin probes that measure the electrical resistance of the respective strip of the resistor material by means of the Kelvin method. The measurement of the electrical resistance before the cutting through of the carrier plate brings along the advantage that the total surface of a respective zone of the electrically conductive material is available for the application of a contact probe, which substantially facilitates a positioning of the contact probe or makes it possible at all due to the small size of the resistor unit and to the small size relationships between the contact probe and the respective zone of the electrically conductive material.

A second aspect of the invention relates to a resistor unit that has been manufactured in accordance with a method in accordance with the invention comprising a carrier, a group of resistor elements arranged at the lower side of the carrier, first electrical terminals that are connected to a respective first end of the resistor element, and second electrical terminals that are connected to a respective second end of the resistor elements, wherein the resistor unit has a width of less than 0.6 mm and a length of less than 0.8 mm, with the width in particular being in a range from 0.3 mm to 0.34 mm and the length in particular being in a range from 0.54 mm to 0.62 mm. The resistor unit is configured for an assembly and a contacting in flip chip construction and due to its small size can be used in electrical components or devices that require a particularly compact design of the resistor units such as cellular phones, smartphones, smart watches, hearing aids, or similar devices.

BRIEF DESCRIPTION OF THE DRAWINGS

The invention will be described in the following by way of example with reference to an advantageous embodiment and to the enclosed drawing. There are shown, schematically in each case, FIG. 1 step a) of an embodiment of a method in accordance with the invention of manufacturing a plurality of resistor units.

DETAILED DESCRIPTION

Figure 1:
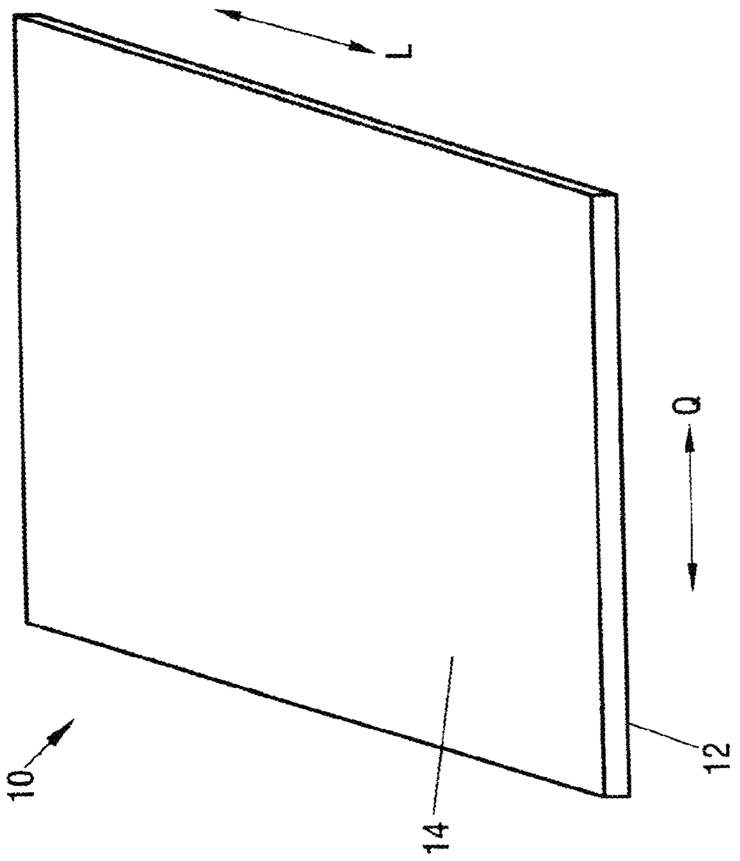

FIG. 1 shows a detail of a carrier plate 10 in accordance with step a) of an embodiment of a method in accordance with the invention of manufacturing a plurality of resistor units. The carrier plate 10 can be formed from a ceramic substrate that forms an electrically insulating carrier device for receiving a resistor material and an electrically conductive material. In FIG. 1, arrows and the letters "Q", "L" designate a transverse direction Q and a longitudinal direction L orthogonal thereto. The transverse direction Q and the longitudinal direction L here define two reference directions that extend perpendicular to one another and do not necessarily designate a longitudinal shape of the carrier plate 10 or of the formed resistor units. The carrier plate 10 comprises an upper side 12 and a lower side 14 that is shown in a plan view in FIG. 1.

Figure 2:
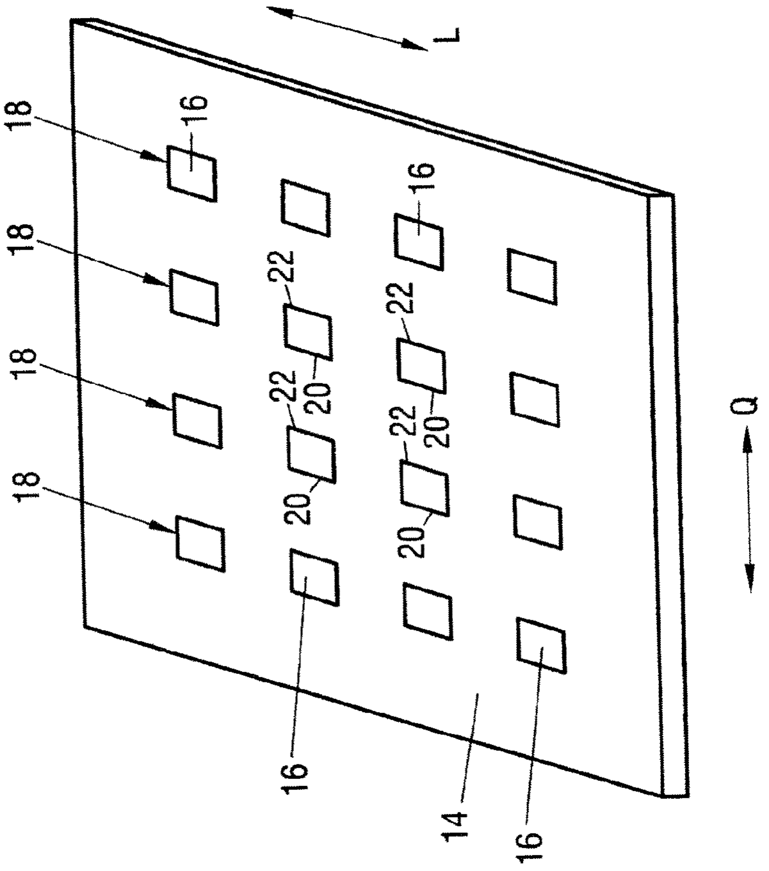
FIG. 2 step b) of the embodiment of FIG. 1.

In step b) of the method in accordance with the invention that is shown in FIG. 2, a plurality of strips 16 of a resistor material are applied to the lower side 14 of the carrier plate 10 in a regular pattern. The strips 16 are arranged in rows 18 that extend in the longitudinal direction L and that are arranged next to one another with respect to the transverse direction Q. FIG. 2 here shows a detail of the carrier plate 10 in which sixteen strips 16 are arranged by way of example in four parallel rows 18. The arrangement of the strips 16 can be continued in accordance with the pattern shown in both of the directions Q and L orthogonal to one another. The strips 16 have a first end 20 and a second end 22 along the transverse direction Q. The application of the resistor material can take place, for example, by cathode atomization, so-called sputtering. This technique offers the advantage that the resistor material can be applied to the lower side 14 of the carrier plate 10 in a layer of uniform thickness and that layers of smaller thickness can also be produced. Other methods are, however, also conceivable to apply the resistor material to the carrier plate 10.

To only apply the resistor material to the carrier plate 10 at the positions of the strips 16, the resistor material can, for example, be applied to the carrier plate in continuous regions extending in parallel along the longitudinal direction L. A laser that removes or vaporizes resistor material at predefined spacings along the longitudinal direction L can be used to form the individual strips 16 (segmentation). A precise and exactly positioned arrangement of the strips 16 can be achieved by means of this method. Alternatively, the lower side 14 of the carrier plate 10 can, for example, be covered prior to the application of the resistor material by a mask, not shown, that has apertures at the position of the strips 16 and can, for example, be produced from plastic. After the application of the resistor material and the subsequent removal of the mask, a regular pattern of a plurality of strips 16 of the resistor material thus results on the carrier plate 10. However, other methods are also conceivable that can be applied alone or in combination with a mask to form the strips 16 of the resistor material precisely and simply and efficiently in this process on the carrier plate 10.

In the embodiment shown, the strips 16 of the resistor material are of equal size with respect to one another, i.e. the strips 16 of the resistor material have the same widths and lengths and the same thicknesses. The strips 16 of the resistor material accordingly have the same electrical resistance values. In other embodiments, the strips can have different sizes to thus produce strips 16 of the resistor material having different electrical resistance values. This can be achieved in a simple manner by a variation of the length of the strips along the longitudinal direction L.

Figure 3:
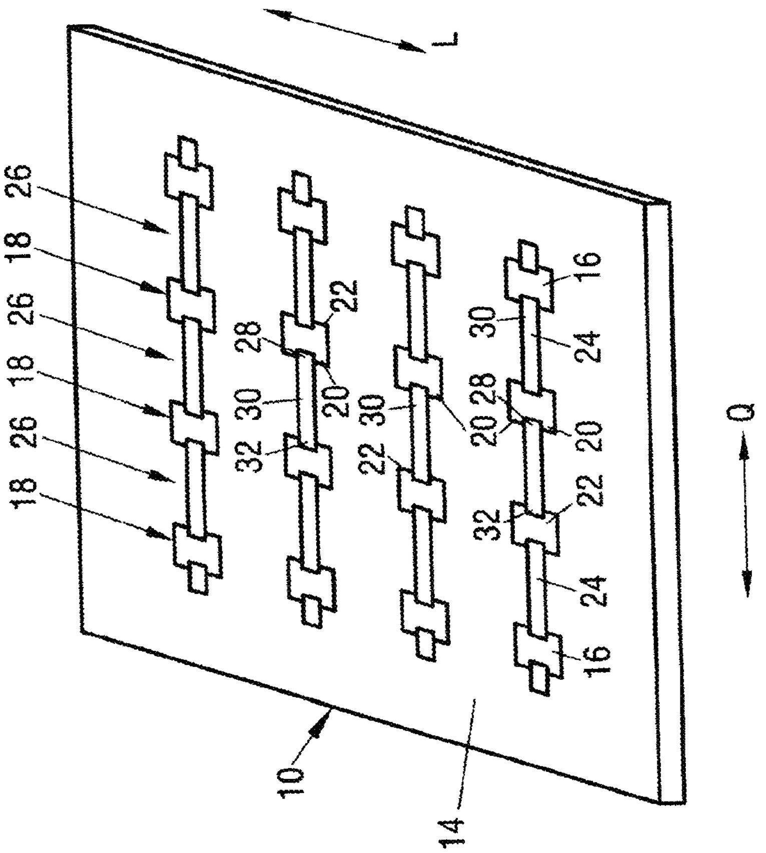
FIG. 3 step c) of the embodiment of FIG. 1.

FIG. 3 shows step c) of the method in accordance with the invention in which a plurality of zones 24 of an electrically conductive material are formed at the lower side 14 of the carrier plate 10. The zones 24 of the electrically conductive material are applied to the carrier plate 10 in a regular pattern, with the zones 24 of the electrically conductive material being arranged in a plurality of rows 26 that extend in the longitudinal direction L and are arranged next to one another with respect to the transverse direction Q. In this respect, the rows 26 of the zones 24 of the electrically conductive material extend in parallel with the rows 18 of the strips 16 of the resistor material and alternate with them in the transverse direction Q so that the plurality of rows 26 of the zones 24 of the electrically conductive material substantially correspond to the number of rows 18 of the strips 16 of the resistor material.

The zones 24 of the electrically conductive material have a respective first end 28, an intermediate region 30, and a second end 32 along the transverse direction Q, wherein, with the exception of at the marginal regions of the carrier plate 10, the strips 16 of the resistor material overlap the first end 28 of a respective zone 24 of the electrically conductive material at their first ends 20 and overlap the second end 32 of a respective zone 24 of the electrically conductive material at their second ends 22. The regular pattern of the zones 24 is coordinated with the regular pattern of the strips 16, and indeed such that a respective overlap region with a respective zone 24 is formed at each strip 16 at its first end 20 and an overlap region with a respective zone 24 is formed at its second end 22.

The zones 24 of the electrically conductive material can, for example, comprise a silver-palladium alloy. The zones 24 can be formed by application in the form of a paste, in particular by printing the lower side 14 of the carrier plate 10. The electrically conductive paste is for this purpose applied to a printing plate, not shown, in a regular pattern corresponding to a predefined arrangement of the zones 24. A plurality of zones 24 of the electrically conductive material can be efficiently produced in a printing process by means of this technique.

Step b) shown in FIG. 2 of forming the plurality of strips 16 of the resistor material and step c) shown in FIG. 3 of forming the plurality of zones 24 of the electrically conductive material can also be carried out in reverse order or simultaneously in part. The overlapping of the strips 16 of the resistor material with the zones 24 of the electrically conductive material can thus either take place such that the respective strip 16 of the resistor material partly covers the respective zones 24 of the electrically conductive material or such that the respective zones 24 of the electrically conductive material partly cover the respective strip 16 of the resistor material.

Figure 4:
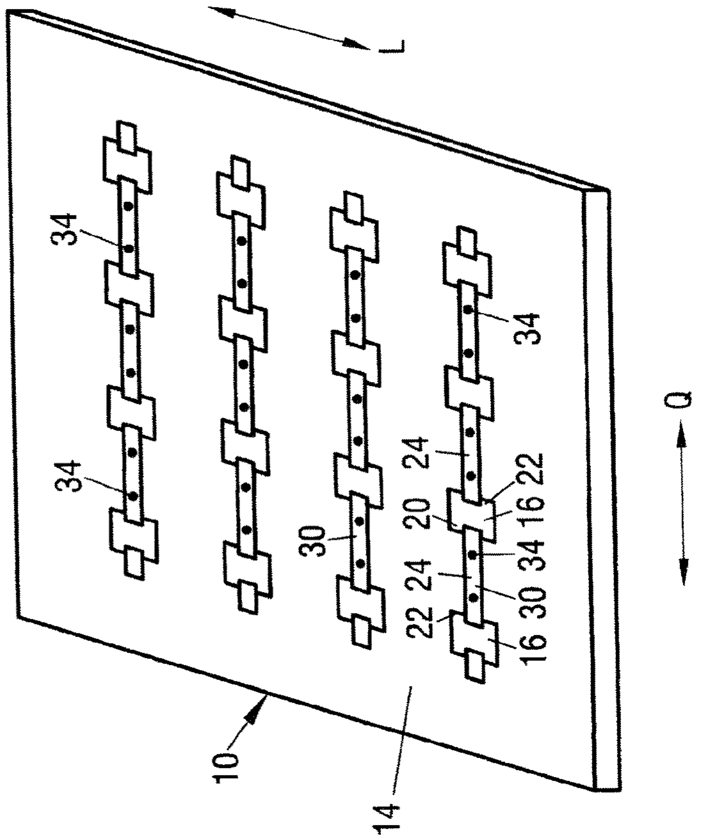
FIG. 4 a function check of the embodiment of FIG. 1.

An optional step of checking the functionality and/or of characterizing the formed resistor units is shown in FIG. 4. For this purpose, contact probes 34, in particular Kelvin probes, are brought into contact with the zones 24 of the electrically conductive material and are associated with a respective strip 16 of the resistor material. Only the contact points of the contact probes 34 are illustrated in FIG. 4.

The contact probes 34 are applied at that zone 24 of the electrically conductive material that overlaps the first end 20 of the respective strip 16 of the resistor material and at that zone 24 of the electrically conductive material that overlaps the second end 22 of the respective strip 16 of the resistor material. In this respect, the contact probes 34 are configured to measure, for example by means of the Kelvin method, the electrical resistance of a respective strip 16 of the resistor material and thus the electrical resistance of the respective resistor element to be formed. Whether the resistance values are in a predefined range or whether deviations are present can then be determined from the measured values.

The application of the contact probes 34 at the respective zones 24 is facilitated by the carrying out of the function test after step c) of the method and before the cutting through of the carrier plate 10 in accordance with step d) since the surface of the intermediate regions 30 of the zones 24 is also available for this purpose at this point in time. At least one pair of contact probes 34 (one contact probe 34 each at the two sides of the respective strip 16) is required for the check of the strips 16 of the resistor material, with a plurality of pairs of contact probes 34 also being able to be used to test a plurality of strips 16 simultaneously.

Figure 5:
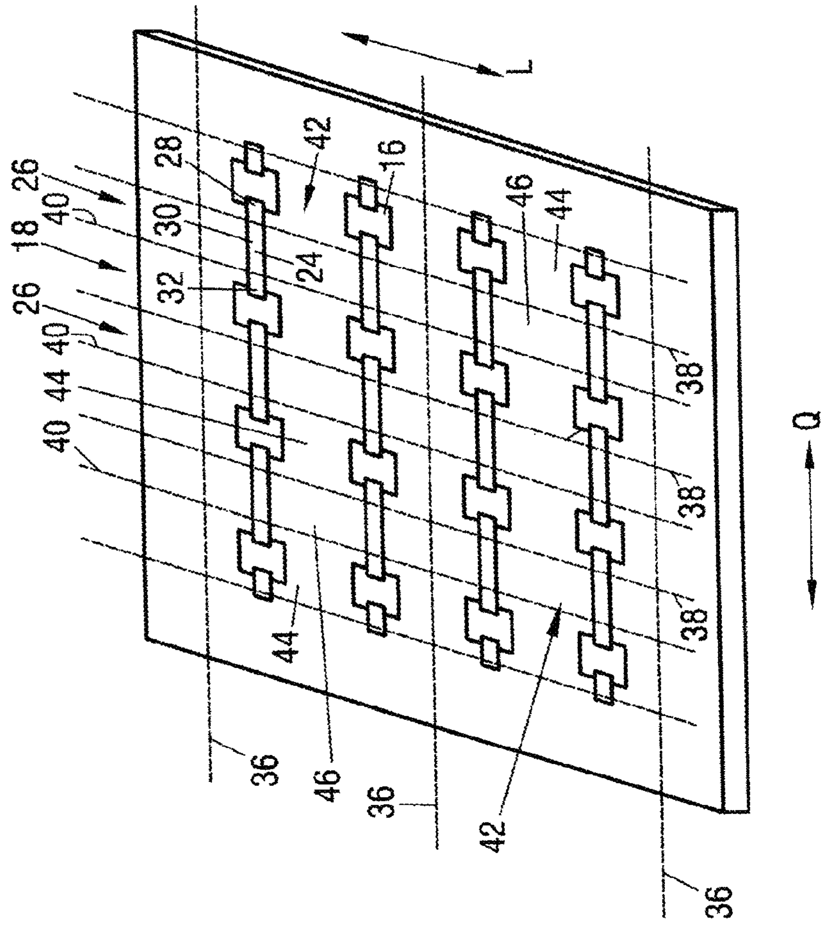
FIG. 5 step d) of the embodiment of FIG. 1.

FIG. 5 shows step d) of the method in accordance with the invention in which a plurality of resistor units 44 are separated from the carrier plate 10 occupied by rows 18 of strips 16 of the resistor material and by rows 26 of zones 24 of the electrically conductive material by a sequence of incisions. The sequence of incisions comprises transverse incisions 36 along the transverse direction Q, first longitudinal incisions 38 along the longitudinal direction L and second longitudinal incisions 40 along the longitudinal direction L.

The regular arrangement of the transverse incisions 36, of the first longitudinal incisions 38, and of the second longitudinal incisions 40 corresponds to the regular pattern of the strips 16 of the resistor material and to the regular pattern of the zones 24 of the electrically conductive material. The transverse incisions 36 here extend between groups 42 of strips 16 of the resistor material associated with one another and adjacent to one another in the longitudinal direction L. The groups 42 each comprise two strips 16 in the described embodiment. The groups 42 can, however, also comprise more strips 16 or only one strip 16. The number of strips 16 of the resistor material of the resistor units 44 can be changed by a simple adaptation of the incision spacings.

The first longitudinal incisions 38 detach the first ends 28 from the intermediate regions 30 of a respective row 26 of zones 24 of the electrically conductive material. In contrast, the second ends 32 are detached from the intermediate regions 30 of a respective row 26 of zones 24 of the electrically conductive material by the second longitudinal incisions 40. A respective resistor unit 44 and a respective residual section 46 of the carrier plate are thus alternately formed by the sequence of incisions 36, 38, 40 along the transverse direction Q. The respective residual section 46 comprises detached intermediate regions 30 of a row 26 of zones 24 of the electrically conductive material and is no longer required after the end of the manufacturing method.

It is understood that the transverse incisions 36, the first longitudinal incisions 38, and the second longitudinal incisions 40 are generally carried out in any desired order for the cutting through of the carrier plate 10. The cutting through of the carrier plate 10 can be carried out, for example, by means of a laser beam, which permits a precise and efficient structuring of the carrier plate 10 in one work process.

The strips 16 of the resistor material can generally have a longitudinal shape (in particular substantially rectangular), with the respective longitudinal axis of the strips 16 of the resistor material being able to be aligned along the longitudinal direction L or along the transverse direction Q. Alternatively to this, the strips 16 of the resistor material can, for example, also have a substantially square shape.

Figure 6:
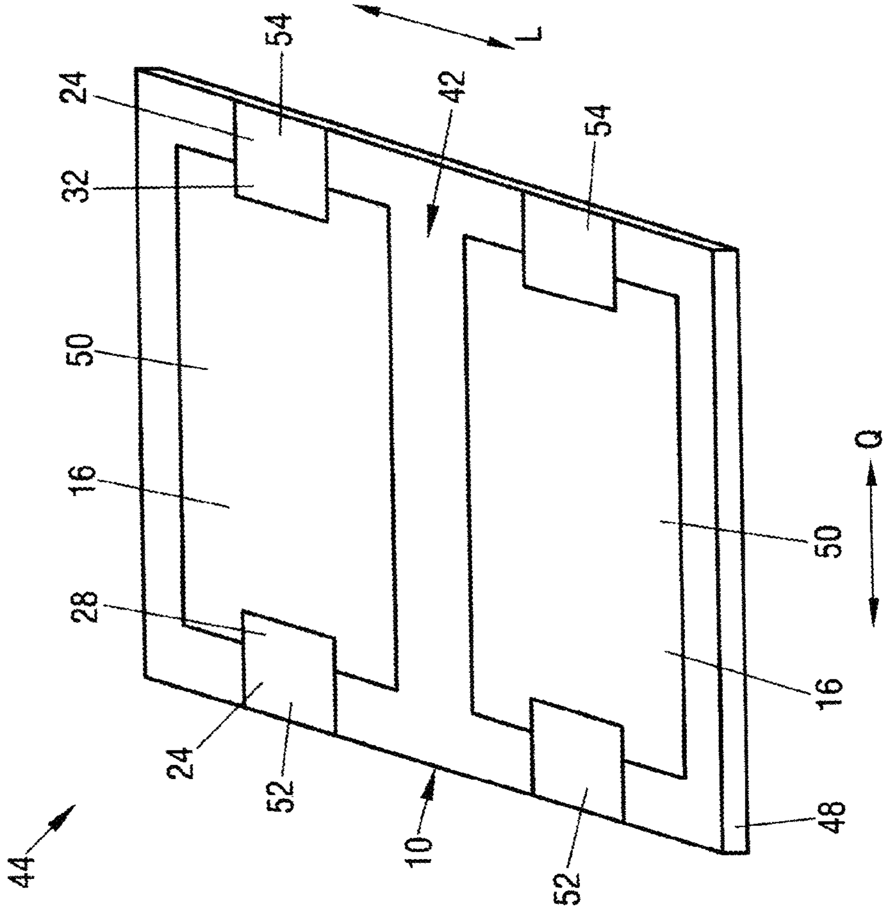
FIG. 6 the lower view of an embodiment of a resistor unit in accordance with the invention.

FIG. 6 shows by way of example in a lower view a resistor unit 44 of the plurality of resistor units that are generated by the steps a) to d) of the explained method. Each resistor unit 44 accordingly comprises a section of the carrier plate 10 that forms the carrier 48 of the resistor unit 44, a group 42 of strips 16 of the resistor material that form a group of resistor elements 50 of the resistor unit 44, a plurality of first ends 28 of zones 24 of the electrically conductive material that form first electrical terminals 52 of the resistor elements 50, and a plurality of second ends 32 of zones 24 of the electrically conductive material that form second electrical terminals 54 of the resistor elements 50. The first electrical terminals 52 are here connected to a respective first end of the resistor elements 50 and the second electrical terminals 54 are connected to a respective second end of the resistor elements 50. The resistor unit 44 is in particular suitable for an assembly and a contacting in a flip chip construction by the arrangement of the resistor elements 50 at the lower side of the carrier 48.

In the method, the mutual spacings of the transverse incisions 36 and the mutual spacings of the first and second longitudinal incisions 38, 40 are selected such that the resistor unit 44 has a width of less than 0.6 mm and a length of less than 0.8 mm, with the width in particular being able to be in a range from 0.3 mm to 0.34 mm and the length in particular being able to be in a range from 0.54 mm to 0.62 mm. Due to its small size, that can be achieved by the method in accordance with the invention, the resistor unit 44 can be used in electrical components or devices that require a particularly small and compact design of the resistor units.

REFERENCE NUMERAL LIST

10 carrier plate
12 upper side
14 lower side
16 strips of the resistor material
18 rows of the strips 16 of the resistor material
20 first end of a strip 16 of the resistor material
22 second end of a strip 16 of the resistor material
24 zone of the electrically conductive material
26 row of the zones 24 of the electrically conductive material
28 first end of a zone 24 of the electrically conductive material
30 intermediate region of a zone 24 of the electrically conductive material
32 second end of a zone 24 of the electrically conductive material
34 contact probe
36 transverse incision
38 first longitudinal incision
40 second longitudinal incision
42 groups of adjacent strips
44 resistor unit
46 residual section
48 carrier
50 resistor element
52 first electrical terminal
54 second electrical terminal
Q transverse direction
L longitudinal direction

The invention claimed is:

1. A method of manufacturing a plurality of resistor units that each comprise a carrier having a group of resistor elements each including ends provided with a respective first and second electrical terminal, the method comprising:

a) providing a carrier plate that has an upper side and a lower side;

b) forming a plurality of strips of a resistor material at the lower side of the carrier plate, that have a first end and a second end along a transverse direction, in a regular pattern such that a respective row of strips of the resistor material is formed along a longitudinal direction that extends perpendicular to the transverse direction and such that a plurality of such rows are arranged next to one another in the transverse direction;

c) forming a plurality of zones of an electrically conductive material at the lower side of the carrier plate, that have a first end, an intermediate region, and a second end along the transverse direction, in a regular pattern such that a respective row of zones of the electrically conductive material is formed along the longitudinal direction and such that a plurality of such rows are arranged next to one another in the transverse direction, wherein the rows of strips of the resistor material and the rows of zones of the electrically conductive material are arranged alternately in the transverse direction, and wherein, with the exception of border regions of the carrier plate, the strips of the resistor material overlap the first end of a respective zone of the electrically conductive material at their first ends and overlap the second end of a respective zone of the electrically conductive material at their second ends; and d) cutting through the carrier plate by regular transverse incisions along the transverse direction, first longitudinal incisions along the longitudinal direction, and second longitudinal incisions along the longitudinal direction such that the transverse incisions extend between groups of strips of the resistor material that are associated with one another and that are adjacent to one another in the longitudinal direction, such that furthermore the first longitudinal incisions detach the first ends from the intermediate regions of a respective row of zones of the electrically conductive material, and such that the second longitudinal incisions detach the second ends from the intermediate regions of a respective row of zones of the electrically conductive material such that a respective resistor unit and a respective residual section of the carrier plate are alternately formed along the transverse direction, said residual section including detached intermediate regions of a row of zones of the electrically conductive material.

2. The method according to claim 1, wherein the respective resistor unit formed by the cutting through of the carrier plate includes a section of the carrier plate that forms the carrier of the resistor unit;

a group of strips of the resistor material that form the group of resistor elements of the resistor unit;

a number of first ends of zones of the electrically conductive material that form the first electrical terminals of the resistor elements; and a number of second ends of zones of the electrically conductive material that forms the second electrical terminals of the resistor elements.

3. The method according to claim 1, wherein mutual spacings of the transverse incisions and mutual spacings of the first and second longitudinal incisions are selected such that the respective formed resistor unit has a width of less than 0.6 mm and a length of less than 0.8 mm.

4. The method according to claim 3, wherein the width is in a range from approximately 0.3 mm to approximately 0.34 mm.

5. The method according to claim 3, wherein the length is in a range from approximately 0.54 mm to approximately 0.62 mm.

6. The method according to claim 1, wherein the group of strips of the resistor material comprises two strips of the resistor material.

7. The method according to claim 1, wherein the strips of the resistor material of the formed resistor unit are of equal size.

8. The method according to claim 1, wherein the strips of the resistor material of the formed resistor unit are of different sizes, in particular with a different width transversely to the extent of the strips of the resistor material between the first end and the second end.

9. The method according to claim 1, wherein the carrier plate comprises a ceramic substrate.

10. The method according to claim 1, wherein the resistor material and the electrically conductive material are only applied to the lower side of the carrier plate.

11. The method according to claim 1, wherein step b) of forming the plurality of strips of the resistor material comprises:

applying a metal layer to the lower side of the carrier plate by cathode atomization; and local removal of the metal layer by vaporization.

12. The method according to claim 1, wherein step c) of forming the plurality of zones of the electrically conductive material comprises:

printing the lower side of the carrier plate with an electrically conductive paste.

13. The method according to claim 1, wherein the cutting through of the carrier plate in step d) takes place by means of a laser beam.

14. The method according to claim 1, wherein the electrical resistance of a respective strip of the resistor material is measured before the cutting through of the carrier plate by the first and second longitudinal incisions, wherein contact probes are applied to that zone of the electrically conductive material that overlaps the first end of the respective strip of the resistor material and to that zone of the electrically conductive material that overlaps the second end of the respective strip of the resistor material.

15. A resistor unit manufactured in accordance with the method according to claim 1, the resistor unit comprising a carrier, a group of resistor elements arranged at the lower side of the carrier, first electrical terminals that are connected to a respective first end of the resistor elements, and second electrical terminals that are connected to a respective second end of the resistor elements, wherein the resistor unit has a width of less than 0.6 mm and a length of less than 0.8 mm.

16. The resistor unit according to claim 15, wherein the width is in a range from approximately 0.3 mm to approximately 0.34 mm.

17. The resistor unit according to claim 15, wherein the length is in a range from approximately 0.54 mm to approximately 0.62 mm.

* * * * *